(12) United States Patent
Li et al.

(10) Patent No.: US 12,219,865 B2
(45) Date of Patent: Feb. 4, 2025

(54) MASK AND FABRICATING METHOD THEREOF, AND DISPLAYING BASE PLATE AND FABRICATING METHOD THEREOF

(71) Applicant: BOE Technology Group Co., Ltd., Beijing (CN)

(72) Inventors: Yunlong Li, Beijing (CN); Pengcheng Lu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 678 days.

(21) Appl. No.: 17/478,068

(22) Filed: Sep. 17, 2021

(65) Prior Publication Data

US 2022/0149282 A1  May 12, 2022

(30) Foreign Application Priority Data

Nov. 9, 2020  (CN) .......................... 202011243457.7

(51) Int. Cl.
*H10K 71/16* (2023.01)
*C23C 14/04* (2006.01)
(Continued)

(52) U.S. Cl.
CPC ......... *H10K 71/166* (2023.02); *C23C 14/042* (2013.01); *C23C 14/24* (2013.01); *C23C 14/34* (2013.01); *H10K 71/00* (2023.02); *H10K 71/10* (2023.02); *H10K 71/164* (2023.02); *B23K 26/22* (2013.01)

(58) Field of Classification Search
None
See application file for complete search history.

(56) References Cited

U.S. PATENT DOCUMENTS

2007/0049033 A1   3/2007  Lee et al.
2013/0186335 A1*  7/2013  Kawato .................. C23C 14/12
                                                    118/720
(Continued)

FOREIGN PATENT DOCUMENTS

CN         1925127 A    3/2007
CN       207331039 U    5/2018
(Continued)

OTHER PUBLICATIONS

First Office Action in the Chinese Patent Application No. 202011243457.7 dated May 6, 2022; English translation attached.

*Primary Examiner* — Feifei Yeung Lopez
(74) *Attorney, Agent, or Firm* — Intellectual Valley Law, P.C.

(57) ABSTRACT

The present disclosure provides a mask and a fabricating method thereof, and a displaying base plate and a fabricating method thereof, and relates to the technical field of displaying. The mask includes a mask part and a peripheral part surrounding the mask part; the mask part includes at least one mask unit, and the mask unit includes an opening and a first main body surrounding the opening; and a thickness of at least part of area of the peripheral part is greater than a thickness of the mask part, and the peripheral part is configured to contact a base plate to be formed with a film, and support the base plate to be formed with a film, whereby the mask part and the base plate to be formed with a film have a gap therebetween.

14 Claims, 5 Drawing Sheets

(51) Int. Cl.
*C23C 14/24* (2006.01)
*C23C 14/34* (2006.01)
*H10K 71/00* (2023.01)
*H10K 71/10* (2023.01)
*B23K 26/22* (2006.01)

(56) References Cited

U.S. PATENT DOCUMENTS

| | | | | |
|---|---|---|---|---|
| 2014/0131743 | A1* | 5/2014 | Jiang | H10K 59/173 |
| | | | | 438/34 |
| 2020/0019056 | A1* | 1/2020 | Ikenaga | C21D 1/76 |
| 2021/0214835 | A1 | 7/2021 | Xu et al. | |
| 2023/0028524 | A1* | 1/2023 | Im | H10K 71/164 |

FOREIGN PATENT DOCUMENTS

| | | |
|---|---|---|
| CN | 109112477 A | 1/2019 |
| CN | 109449315 A | 3/2019 |
| CN | 109913805 A | 6/2019 |
| CN | 110029307 A | 7/2019 |
| CN | 111676447 A | 9/2020 |
| JP | 2012031473 A | 2/2012 |
| KR | 20160049165 A | 5/2016 |

\* cited by examiner forming the mask part and the peripheral part surrounding the mask part — S01

MASK AND FABRICATING METHOD THEREOF, AND DISPLAYING BASE PLATE AND FABRICATING METHOD THEREOF

The application claims priority to Chinese Patent Application No. 202011243457.7, titled "MASK AND FABRICATING METHOD THEREOF, AND DISPLAYING BASE PLATE AND FABRICATING METHOD THEREOF" and filed to the State Patent Intellectual Property Office on Nov. 9, 2020, the contents of which are incorporated herein by reference in its entirety.

TECHNICAL FIELD

The present disclosure relates to the technical field of displaying, and particularly relates to a mask and a fabricating method thereof, and a displaying base plate and a fabricating method thereof.

BACKGROUND

When a vapor-depositing process is used to fabricate the organic layer and the cathode of Micro LED (Micro-Light Emitting Diode) micro-displaying devices, a vapor-deposition mask (Open Mask) is required to be used. In vapor deposition, both of the dust (Particle) adhering to the vapor-deposition mask itself and the dust generated during the vapor deposition process directly affect the yield of the product.

SUMMARY

The embodiments of the present disclosure provide a mask and a fabricating method thereof, and a displaying base plate and a fabricating method thereof.

The embodiments of the present disclosure employ the following technical solutions:

in an aspect, there is provided a mask, wherein the mask comprises a mask part and a peripheral part surrounding the mask part;

the mask part comprises at least one mask unit, and the mask unit comprises an opening and a first main body surrounding the opening; and a thickness of at least part of area of the peripheral part is greater than a thickness of the mask part, and the peripheral part is configured to contact a base plate to be formed with a film, and support the base plate to be formed with a film, whereby the mask part and the base plate to be formed with a film have a gap therebetween.

Optionally, the peripheral part comprises a second main body and a plurality of supporters;

the supporters are provided on one side of the second main body closer to the base plate to be formed with a film; and a thickness of the second main body and a thickness of the first main body are equal.

Optionally, the first main body and the second main body is of an integral structure, and the first main body and the second main body are formed by using a one-step patterning process.

Optionally, each of the supporters comprises a supporting gasket, and a thickness of the supporting gasket ranges from 90 μm to 110 μm.

Optionally, the peripheral part and an edge of the mask part form a step.

Optionally, a height of the step ranges from 40 μm to 100 μm.

Optionally, the peripheral part extends under a fixing unit, the fixing unit is configured to fix the mask.

In another aspect, there is provided a displaying base plate, wherein the displaying base plate comprises: a substrate and a film-layer pattern provided on the substrate, and the film-layer pattern is formed by using the mask stated above.

In yet another aspect, there is provided a fabricating method of the mask, wherein the method comprises:

forming the mask part and the peripheral part surrounding the mask part, wherein the mask part comprises at least one mask unit, and the mask unit comprises an opening and a first main body surrounding the opening; and a thickness of at least part of area of the peripheral part is greater than a thickness of the mask part, and the peripheral part is configured to contact a base plate to be formed with a film, and support the base plate to be formed with a film, whereby the mask part and the base plate to be formed with a film have a gap therebetween.

Optionally, the peripheral part comprises a second main body and a plurality of supporters; and the step of forming the mask part and the peripheral part surrounding the mask part comprises:

forming the mask part and the second main body; and forming the plurality of supporters.

Optionally, after the step of forming the plurality of supporters, the step of forming the mask part and the peripheral part surrounding the mask part further comprises:

fixing the plurality of supporters to the second main body by using laser spot welding.

Optionally, the step of forming the mask part and the peripheral part surrounding the mask part comprises:

forming a mask plate, wherein the mask plate comprises a mask region and a peripheral region surrounding the mask region; and etching the mask region, to obtain the mask part and the peripheral part surrounding the mask part, wherein the peripheral part and an edge of the mask part form a step.

In still another aspect, there is provided a fabricating method of a displaying base plate, wherein the method comprises:

providing a base plate to be formed with a film;

providing the mask stated above;

aligning the base plate to be formed with a film and the mask, to cause the peripheral part of the mask to contact the base plate to be formed with a film, to support the base plate to be formed with a film, and to cause the opening of the mask part of the mask to correspond to a film-formation region of the base plate to be formed with a film, and the first main body of the mask part of the mask and the peripheral part of the mask to correspond to a non-film-formation region of the base plate to be formed with a film; and depositing a film-layer material to the film-formation region of the base plate to be formed with a film via the opening of the mask part, to form the film-layer pattern.

Optionally, the step of depositing a film-layer material to the film-formation region of the base plate to be formed with a film via the opening of the mask part, to form the film-layer pattern comprises:

depositing the film-layer material, by using a vapor deposition or sputtering process, to the film-formation region of the base plate to be formed with a film via the opening of the mask part, to form the film-layer pattern.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present application are provided below.

BRIEF DESCRIPTION OF THE DRAWINGS

In order to more clearly illustrate the technical solutions of the embodiments of the present disclosure or the prior art, the figures that are required to describe the embodiments or the prior art will be briefly introduced below. Apparently, the figures that are described below are merely embodiments of the present disclosure, and a person skilled in the art can obtain other figures according to these figures without paying creative work.

DETAILED DESCRIPTION

The technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

In the embodiments of the present disclosure, terms such as "first" and "second" are used to distinguish identical items or similar items that have substantially the same functions and effects, merely in order to clearly describe the technical solutions of the embodiments of the present disclosure, and should not be construed as indicating or implying the degrees of importance or implicitly indicating the quantity of the specified technical features.

In the embodiments of the present disclosure, the meaning of "plurality of" is "two or more", and the meaning of "at least one" is "one or more", unless explicitly and particularly defined otherwise.

Figure 1:
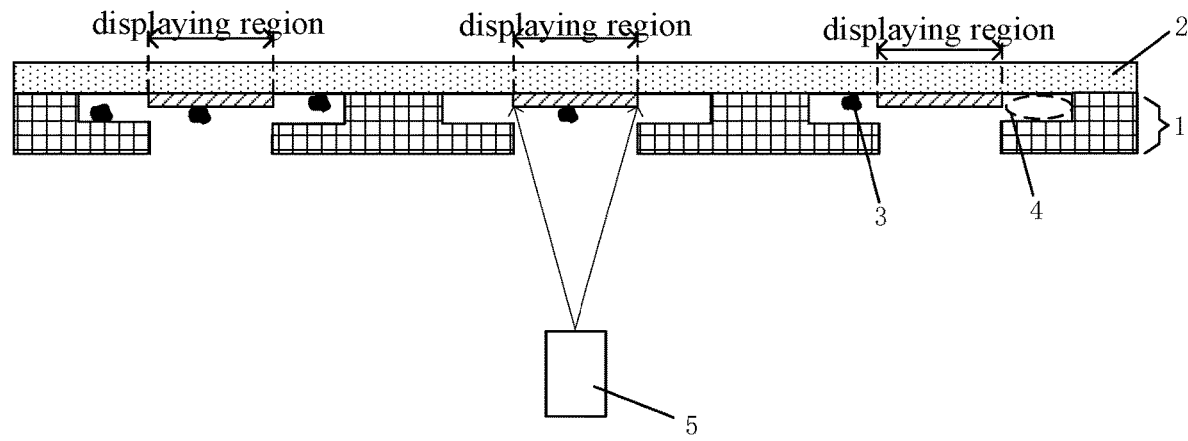
FIG. 1 is a schematic structural diagram of the vapor deposition to a wafer by using a half-etching mask according to an embodiment of the present disclosure.

An embodiment of the present disclosure provides a mask. Referring to FIG. 1, the half-etching mask 1 is provided with half-etching holes 4 on the one side contacting the wafer 2 to receive the dust 3. However, the half-etching holes fabricated by using a half-etching process are small, and, in the process when the vapor-deposition source 5 vapor-deposits the film-layer material to the displaying region via the half-etching mask 1, the dust 3 still splashes to the displaying region (Active Area) of the wafer 2. The half-etching mask closely clings to the wafer via a magnetic strip (not shown in FIG. 1) over the wafer, and a large amount of dust transfers from the mask to the wafer, which seriously affects the subsequent packaging process.

Figure 2:
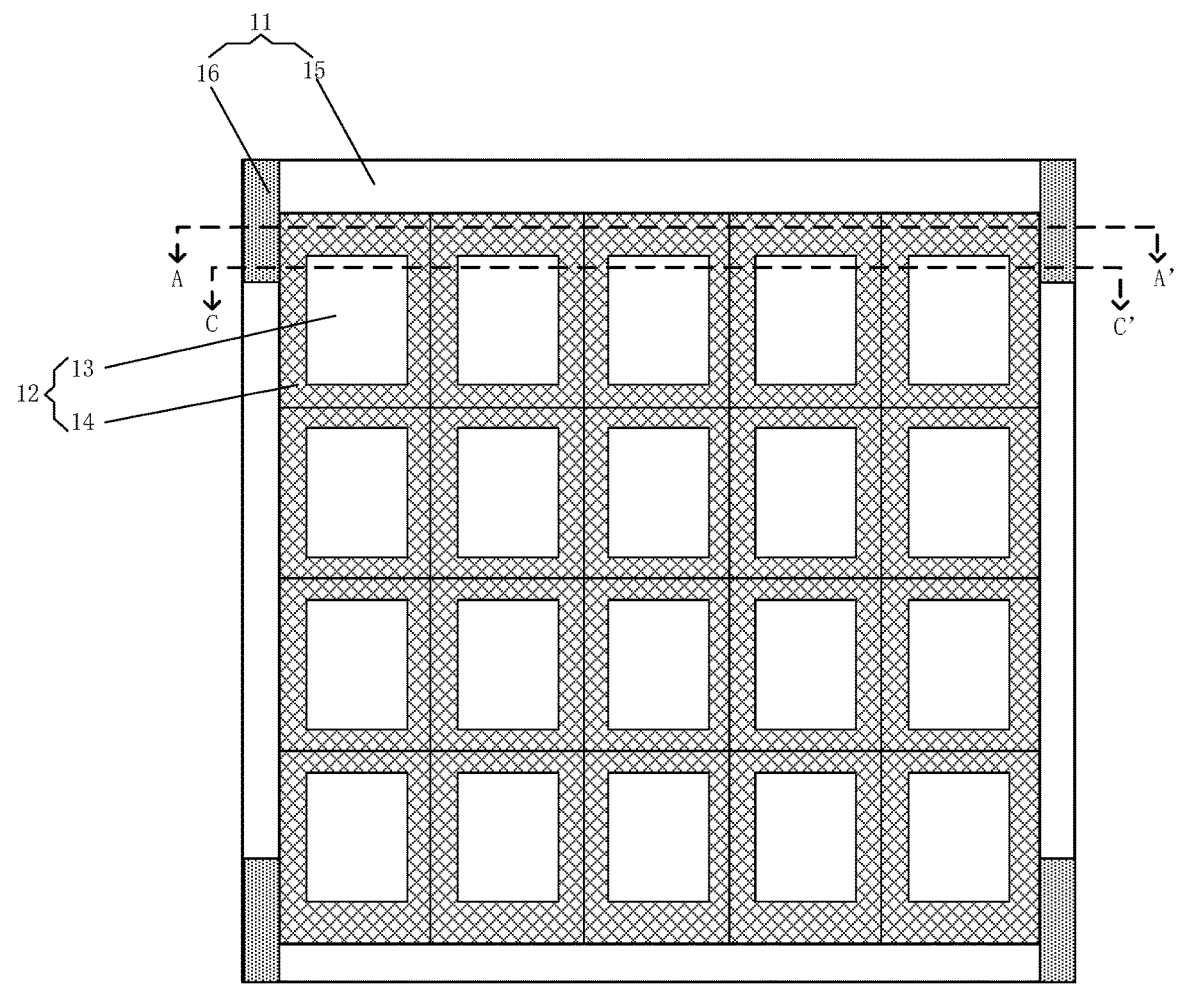
FIG. 2 is a schematic structural diagram of the mask according to an embodiment of the present disclosure.
Figure 3:
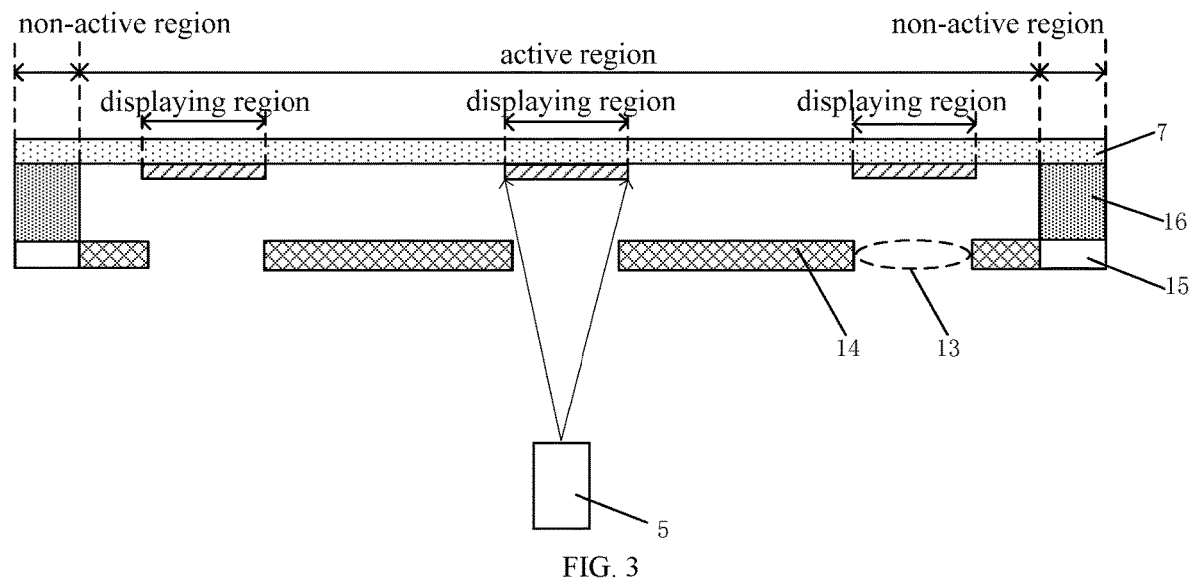
FIG. 3 is a schematic structural diagram of the vapor deposition to a base plate to be formed with a film by using the mask shown in FIG. 2 according to an embodiment of the present disclosure.
Figure 4:
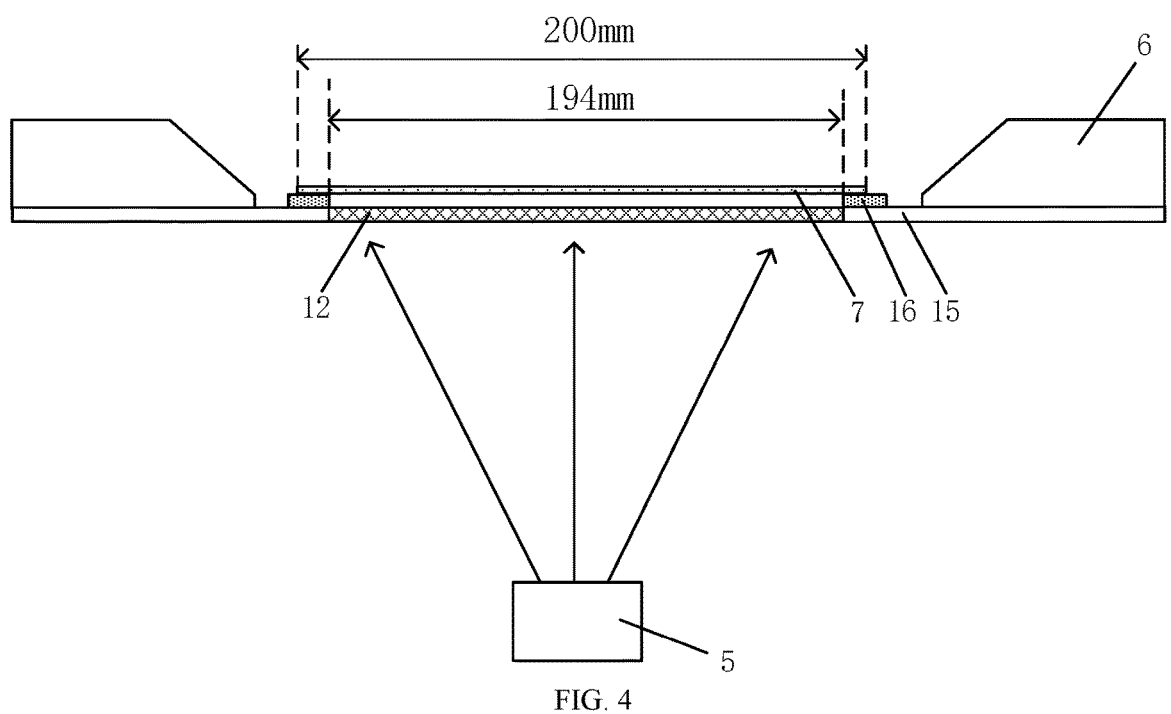
FIG. 4 is a schematic structural diagram of the vapor deposition to a base plate to be formed with a film by using the mask shown in FIG. 2 according to another embodiment of the present disclosure.

In view of that, in order to further alleviate the affection by dust, thereby greatly improving the yield of the product, an embodiment of the present disclosure provides a mask. Referring to FIGS. 2-4, the mask comprises a mask part and a peripheral part 11 surrounding the mask part; the mask part comprises at least one mask unit 12, and the mask unit 12 comprises an opening 13 and a first main body 14 surrounding the opening 13; and the thickness of at least part of the area of the peripheral part 11 is greater than the thickness of the mask part, and the peripheral part is configured to contact a base plate to be formed with a film, and support the base plate to be formed with a film, whereby the mask part and the base plate to be formed with a film have a gap therebetween.

In the mask, that the thickness of at least part of the area of the peripheral part is greater than the thickness of the mask part refers to that the thickness of part of the area of the peripheral part is greater than the thickness of the mask part, or the thickness of the whole of the area of the peripheral part is greater than the thickness of the mask part.

The shape of the opening of the mask unit is not limited herein, and its cross-sectional shape parallel to the mask may be a rectangle, as shown in FIG. 2, or may also be a circle, a square and so on, which may be determined according to the shape of the film-layer pattern in practice.

The mask is an opening mask (Open Mask), and is mainly applied to the fabrication of the organic layer or the cathode of Micro-LED micro-displaying devices or AMOLED (Active Matrix Organic Light Emitting Diode) displaying devices. The Micro-LED micro-displaying devices may employ a structure of the combination between white-light emitting units and a light filter layer, to realize colored displaying.

In the mask, the mask material at the opening has been removed. When the mask is being used to form the film-layer pattern, the film-layer material may deposit to the film-formation region of the base plate to be formed with a film via the opening.

The mask material is not limited herein. As an example, the mask material may comprise invar alloy (Invar), for example, Invar36, wherein Invar36 is an iron-nickel alloy having an extra-low coefficient of expansion.

When the mask is being used to form the film-layer pattern on the base plate to be formed with a film, the peripheral part of the mask contacts the base plate to be formed with a film, and supports the base plate to be formed with a film, whereby the mask part of the mask and the base plate to be formed with a film have a gap therebetween. Accordingly, in an aspect, the gap between the first main body of the mask part and the base plate to be formed with a film can receive the dust generated during the fabrication process, which greatly reduces the adhesion of the dust to the film-formation region of the base plate to be formed with a film via the opening of the mask part. In another aspect, the peripheral part of the mask can support the base plate to be formed with a film, and therefore it is not required to provide a magnetic strip over the base plate to be formed with a film. As compared with the half-etching mask shown in FIG. 1, the mask contacts the base plate to be formed with a film only at the peripheral part, which greatly reduces the contact area between the mask and the base plate to be formed with a film, thereby highly reducing the transferring of the dust on the mask to the base plate to be formed with a film. The mask can greatly alleviate the affection by dust, thereby improving the yield of the product.

A particular structure of the mask will be provided below.

Referring to FIGS. 2-4, the peripheral part 11 comprises a second main body 15 and a plurality of supporters 16; the supporters 16 are provided on the one side of the second main body 15 that is closer to the base plate to be formed with a film 7; and the thickness of the second main body 15 and the thickness of the first main body 14 are equal. In this case, the thickness of the region of the peripheral part where the supporters are provided is greater than the thickness of the mask part.

Figure 5:
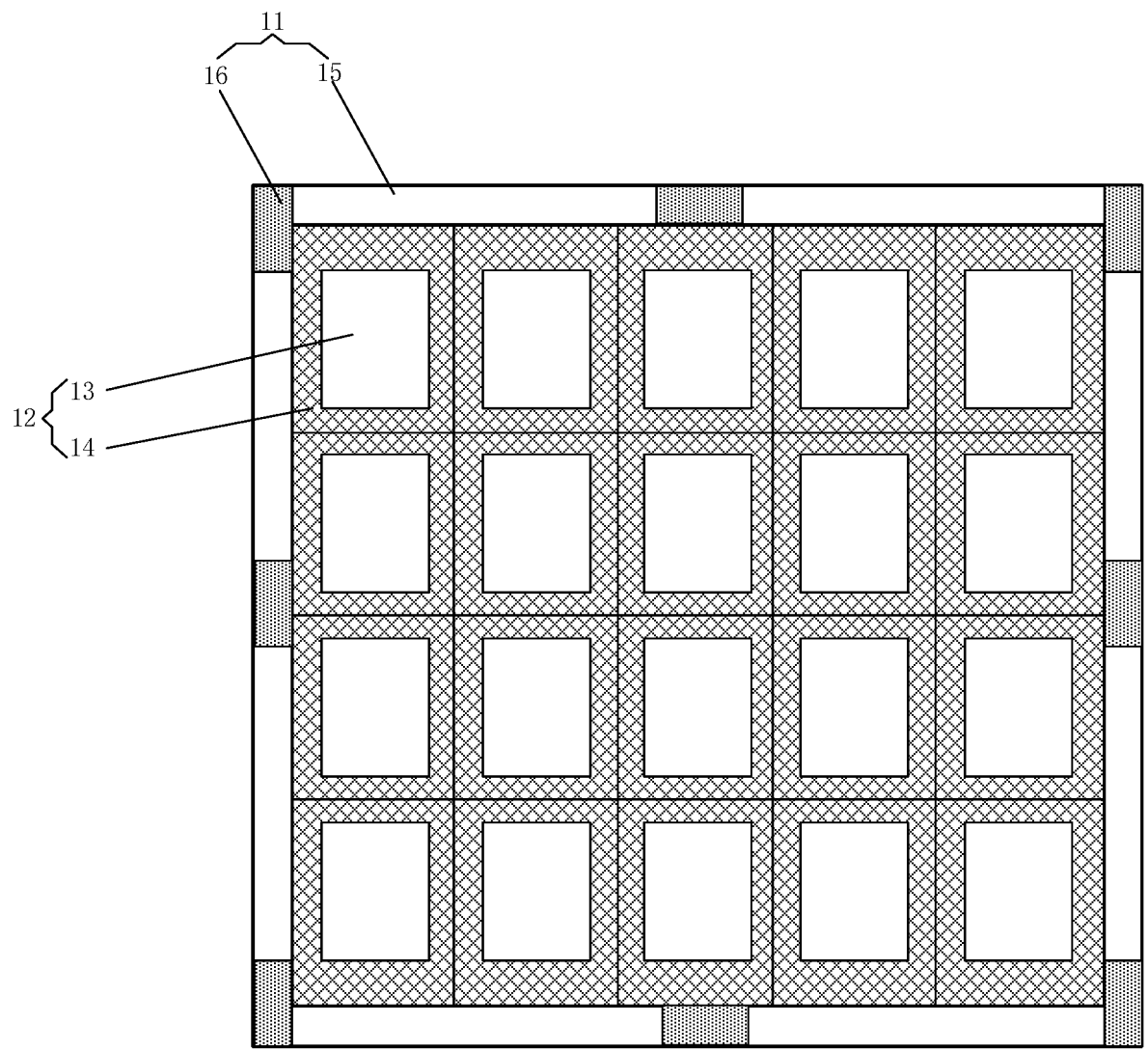
FIG. 5 is a schematic structural diagram of the mask according to another embodiment of the present disclosure.

The shapes, the sizes, the quantity, the distribution mode and the materials of the plurality of supporters are not limited. As an example, the cross-sectional shape of the supporters that are parallel to the mask may be a rectangle, as shown in FIG. 2, or a circle, a trapezoid and so on. If the quantity of the supporters is higher, the supporting performance for the base plate to be formed with a film is better, but at the same time that will increase the contact area with the base plate to be formed with a film. Therefore, the quantity of the supporters should not be too large, to reduce the contact area with the base plate to be formed with a film to the largest extent, to further reduce the probability of dust transferring to the base plate to be formed with a film. Moreover, the quantity of the supporters should not be too small, to ensure the strength of supporting. As an example, referring to FIG. 2, the peripheral part of the mask comprises 4 strip-shaped supporters, and the 4 strip-shaped supporters are individually provided at the four corners of the peripheral part. Alternatively, referring to FIG. 5, the peripheral part of the mask comprises 8 strip-shaped supporters, and the 8 strip-shaped supporters are individually provided at the four corners of the peripheral part, and the middle of the four side edges.

The first main body and the second main body may be of an integral structure, which can be formed by using a one-step patterning process, to reduce the fabrication cost.

It should be noted that the structure of the mask shown in FIG. 3 is a cross-sectional view in the direction of CC' in FIG. 2, and the structure of the mask shown in FIG. 4 is a cross-sectional view in the direction of AA' in FIG. 2.

Referring to FIGS. 3 and 4, when the mask is being used to form the film-layer pattern on the base plate to be formed with a film, the supporters 16 of the peripheral part of the mask contact the base plate to be formed with a film 7, and support the base plate to be formed with a film 7, whereby the mask part 11 of the mask and the base plate to be formed with a film 7 have a gap therebetween. Accordingly, in an aspect, the gap between the first main body 14 of the mask part and the base plate to be formed with a film 7 can receive the dust generated during the fabrication process, which greatly reduces the adhesion of the dust to the film-formation region (i.e., the displaying regions shown in FIG. 3) of the base plate to be formed with a film 7 via the opening 13 of the mask part. In another aspect, the supporters 16 of the peripheral part of the mask can support the base plate to be formed with a film 7, and therefore it is not required to provide a magnetic strip over the base plate to be formed with a film. As compared with the half-etching mask shown in FIG. 1, the mask contacts the base plate to be formed with a film 7 only at the supporters 16 of the peripheral part, which greatly reduces the contact area between the mask and the base plate to be formed with a film, thereby highly reducing the transferring of the dust on the mask to the base plate to be formed with a film. The mask can greatly alleviate the affection by dust, thereby improving the yield of the product. FIGS. 3 and 4 illustrate by taking the case as an example in which the vapor-deposition source 5 deposits the film-layer material to the film-formation region (i.e., the displaying regions) of the base plate to be formed with a film 7 via the opening 13 of the mask part.

In order to reduce the fabrication difficulty, optionally, each of the supporters comprises a supporting gasket, and a thickness of the supporting gasket ranges from 90 μm to 110 μm. As an example, the thickness of the supporting gasket may be 90 μm, 95 μm, 100 μm, 105 μm, 110 μm and so on. The fabrication size of the supporting gasket may be 5 mm*10 mm, and, certainly, may also be other sizes, which is not limited herein.

Such a thickness of the supporting gasket, in an aspect, ensures that the mask part and the base plate to be formed with a film have a sufficient gap therebetween, to accommodate the dust, and, in another aspect, ensures that, when the film-layer pattern is being formed by using a vapor deposition process, the generated vapor-deposition shadow is in an acceptable range. It can be seen by practical testing that, when the mask is being used to form the film-layer pattern by vapor deposition, a vapor-deposition shadow of approximately 100 μm is generated, which can satisfy the requirements on white-light Micro-LED micro-displaying devices. In addition, the size of the opening of the mask may be reduced to further reduce the vapor deposition diffusion.

A particular structure of another mask will be provided below.

Figure 6:
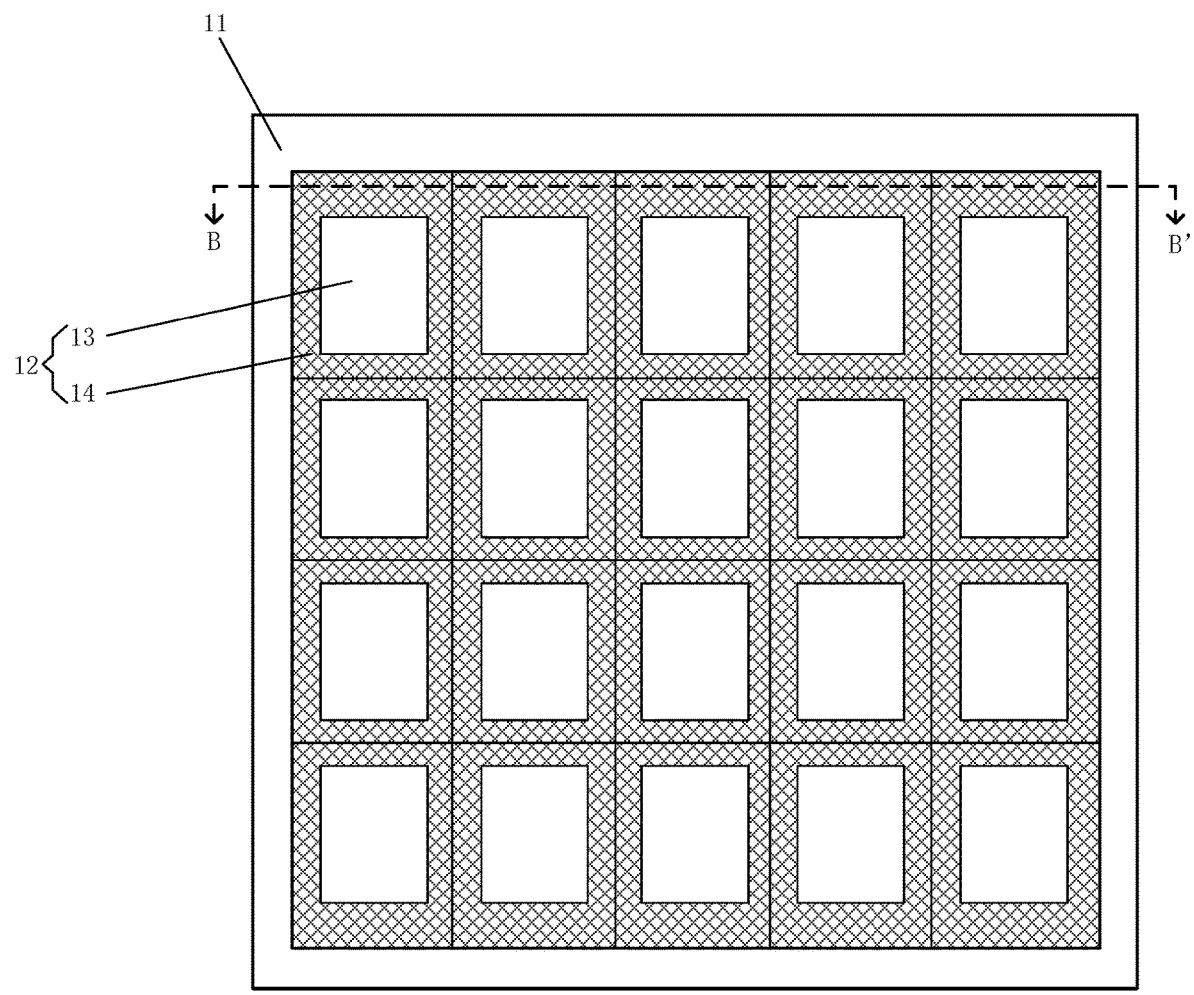
FIG. 6 is a schematic structural diagram of the mask according to yet another embodiment of the present disclosure.
Figure 7:
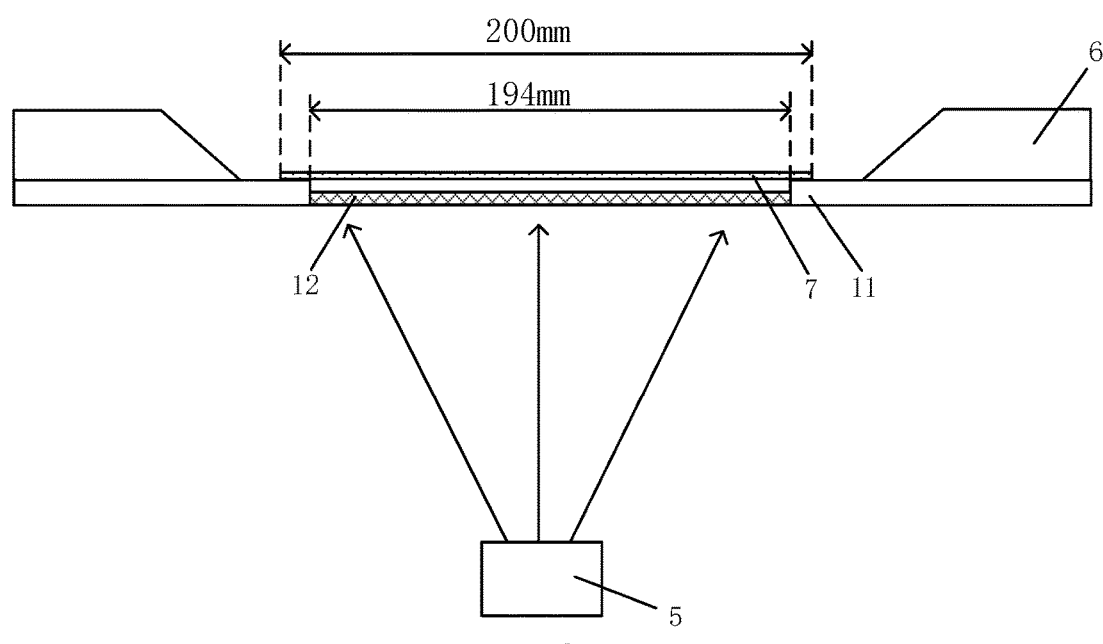
FIG. 7 is a schematic structural diagram of the vapor deposition to a base plate to be formed with a film by using the mask shown in FIG. 6 according to an embodiment of the present disclosure.

Referring to FIGS. 6 and 7, the peripheral part and an edge of the mask part form a step. In this case, the height of the whole of the area of the peripheral part is greater than the height of the mask part. When the mask is being used to form the film-layer pattern on the base plate to be formed with a film, the peripheral part 11 of the mask contacts the base plate to be formed with a film 7, and supports the base plate to be formed with a film 7, whereby the mask part of the mask and the base plate to be formed with a film 7 have a gap therebetween.

The mode of the formation of the step is not limited herein. As an example, the mask plate may be etched by using a full etching process, to obtain the mask.

It should be noted that the structure of the mask shown in FIG. 7 is a cross-sectional view in the direction of BB' in FIG. 6. FIG. 7 illustrates by taking the case as an example in which the vapor-deposition source 5 deposits the film-layer material to the film-formation region of the base plate to be formed with a film 7 via the opening of the mask part.

Optionally, the height of the step ranges from 40 μm to 100 μm. As an example, the height of the step may be 40 μm, 60 μm, 80 μm, 100 μm and so on. Such a height range can ensure that the mask part and the base plate to be formed with a film have a sufficient gap therebetween, to accommodate the dust, and, moreover, ensure that, when the film-layer pattern is being formed by using a vapor deposition process, the generated vapor-deposition shadow is in an acceptable range. In addition, the thickness of the mask plate usually has three specifications of 0.1 mm, 0.15 mm and 0.2 mm. If the mask plate of the specification of 0.2 mm is used to fabrication the mask, then if the height of the step is greater, then the thickness of the mask part is smaller. Moreover, the mask will be washed after being used, and if the thickness of the mask part is too small, it is easily damaged during the washing, and has a short service life. Therefore, the height of the step is required to be controlled within the above range, to satisfy the requirements by the multiple aspects.

It should be noted that FIGS. 3, 4 and 7 illustrate by taking the case as an example in which the base plate to be formed with a film comprises a wafer. As an example, the wafer is an 8-inch wafer, its diameter is 200 mm, and the wafer comprises an active region and a non-active region surrounding the active region. The active region has a cross-section size perpendicular to the wafer of 194 mm, and comprises a plurality of base-plate units, and each of the base-plate units comprises a displaying region and a non-displaying region. By cutting the plurality of base-plate units of the wafer, a plurality of displaying base plates can be obtained. If the wafer is to be used to form a plurality of micro-displaying devices, then, when the organic layer or the cathode is being formed on the wafer, the plurality of openings of the mask may individually correspond to the plurality of displaying regions (i.e., the film-formation region) of the wafer, the first main body of the mask may correspond to the non-displaying regions, and the peripheral part of the mask may correspond to the non-active region. At this point, the non-film-formation regions of the wafer include the non-displaying regions and the non-active region.

In addition, referring to FIGS. 4 and 7, if the film-layer pattern is formed on the base plate to be formed with a film by using a vapor deposition process, the peripheral part of the mask may also extend under a fixing unit 6, to facilitate the fixing unit to fix the mask. The shape of the fixing unit is not limited herein. In FIGS. 4 and 7, the side of the fixing unit that is closer to the mask is configured to be a bevel, to facilitate the operation.

An embodiment of the present disclosure further provides a displaying base plate, wherein the displaying base plate comprises: a substrate and a film-layer pattern provided on the substrate, and the film-layer pattern is formed by using the mask stated above.

The displaying base plate may be silicon-based, or may also be glass-based, which is not limited herein. The displaying base plate may be used to form a Micro-LED micro-displaying device or an OLED (Organic Light Emitting Diode) displaying device, or may also be used to form any products or components having a displaying function that comprise the Micro-LED micro-displaying device or OLED displaying device, such as a television set, a digital camera, a mobile phone and a tablet personal computer.

Figures 8, 9:
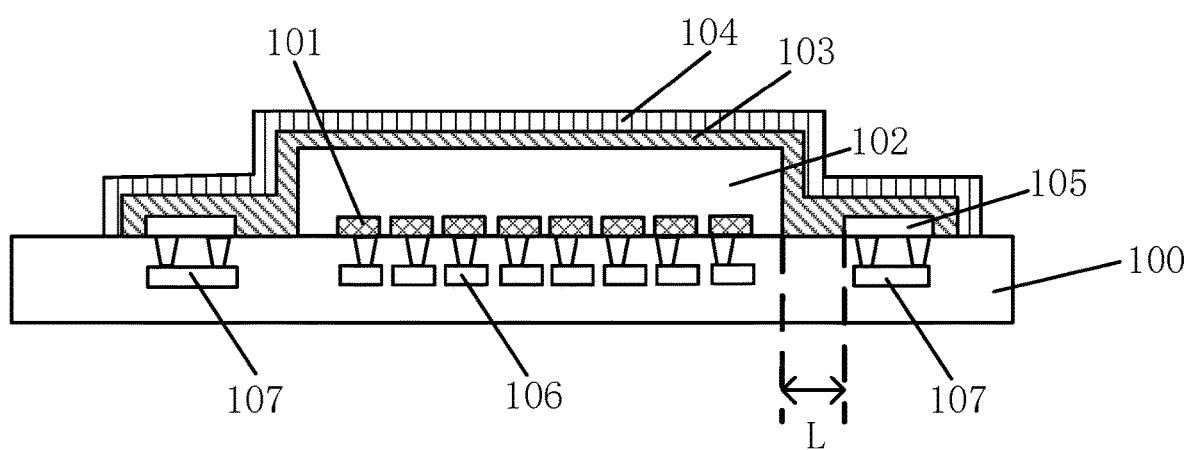
FIG. 8 is a schematic structural diagram of the micro-displaying device according to an embodiment of the present disclosure.
FIG. 9 is a schematic diagram of the fabricating method of the mask according to an embodiment of the present disclosure.

Referring to FIG. 8, a silicon-based Micro-LED micro-displaying device may comprise a wafer base plate 100, and film-layer components that are provided on the wafer base plate 100 and are located within the displaying regions, such as an anode array layer (comprising a plurality of anodes 101), an organic layer 102, a cathode 103, and a light transmission layer (CPL layer) 104. Certainly, the silicon-based Micro-LED micro-displaying device further comprises cathode connecting units 105 located within the non-displaying regions, and the cathode 103 extends to the non-displaying regions, and is electrically connected to the cathode connecting units 105. The wafer base plate 100 comprises a plurality of first driving units 106 located within the displaying regions and a plurality of second driving units 107 located within the non-displaying regions. The plurality of first driving units 106 are individually electrically connected to the plurality of anodes 101 of the anode array layer by a plurality of via holes (not shown in FIG. 8), to drive the plurality of anodes 101. The plurality of second driving units 107 are individually electrically connected to the cathode connecting units 105 by a plurality of via holes (not shown in FIG. 8), to drive the cathode 103. When the organic layer is being fabricated by using a vapor deposition process, it is required to completely cover the region where the anode array layer is located. Moreover, in order to reduce the contact impedance of the cathode, the organic matter should not be vapor-deposited to the region where the cathode connecting units are located. Therefore, it is required to leave a certain spacing L (for example, 0.5 mm) between the cathode connecting units and the anode array layer, as a region (Margin) reserved for the vapor-deposition face. The cathode may cover the cathode connecting units, and coat its side edges. The light transmission layer may cover the cathode, and coat its side edges.

Referring to FIG. 9, an embodiment of the present disclosure further provides a fabricating method of the mask stated above, wherein the method comprises:

S01: forming the mask part and the peripheral part surrounding the mask part, wherein the mask part comprises at least one mask unit, and the mask unit comprises an opening and a first main body surrounding the opening; and a thickness of at least part of area of the peripheral part is greater than a thickness of the mask part, and the peripheral part is configured to contact a base plate to be formed with a film, and support the base plate to be formed with a film, whereby the mask part and the base plate to be formed with a film have a gap therebetween.

A fabricating method of the mask shown in FIG. 2 will be provided below.

Optionally, the peripheral part comprises a second main body and a plurality of supporters, and, accordingly, S01: forming the mask part and the peripheral part surrounding the mask part comprises:

S11: forming the mask part and the second main body.

As an example, the mask part and the second main body may be formed by using a one-step patterning process.

S12: forming the plurality of supporters.

The shapes, the sizes, the quantity, the distribution mode and the materials of the supporters are not limited herein. If the quantity of the supporters is higher, the supporting performance for the base plate to be formed with a film is better, but at the same time that will increase the contact area with the base plate to be formed with a film. Therefore, the quantity of the supporters should not be too large, to reduce the contact area with the base plate to be formed with a film to the largest extent, to further reduce the probability of dust transferring to the base plate to be formed with a film. Moreover, the quantity of the supporters should not be too small, to ensure the strength of supporting. FIG. 2 illustrates by taking 4 strip-shaped supporters as an example.

The supporters may comprise a supporting gasket. The thickness of the supporting gasket may be 100 μm, and the fabrication precision is controlled at ±10 μm. The fabrication size of the supporting gasket may be 5 mm*10 mm, and, certainly, may also be other sizes, which is not limited herein.

Optionally, in order to fix the supporters, to serve to support better, after S12: forming the plurality of supporters, S11: forming the mask part and the peripheral part surrounding the mask part further comprises:

S13: fixing the plurality of supporters to the second main body by using laser spot welding.

In order to ensure that the welding spots do not affect the fabrication precision, spot welding may be performed at the vapor-deposition face. The vapor-deposition face used herein refers to the surface of the one side of the mask that is closer to the base plate to be formed with a film.

A fabricating method of the mask shown in FIG. 6 will be provided below. Referring to FIG. 7, the peripheral part and an edge of the mask part form a step.

S01: forming the mask part and the peripheral part surrounding the mask part comprises:

S21: forming a mask plate, wherein the mask plate comprises a mask region and a peripheral region surrounding the mask region.

The material of the mask plate may comprise invar alloy (Invar), for example, Invar36. The thickness of the mask plate may be 0.2 mm.

S22: etching the mask region, to obtain the mask part and the peripheral part surrounding the mask part, wherein the peripheral part and an edge of the mask part form a step.

As an example, this step comprises etching the mask region by using a full etching process, to reduce the thickness of the entire mask region, whereby the peripheral part and an edge of the mask part form a step; and, subsequently, patterning the mask region, to form the mask part comprising at least one opening.

The etching depth ranges from 40 μm to 100 μm, to form a step of a height ranging from 40 μm to 100 μm.

The fabricating method of the mask is simple and easy to implement, and has a good operability. The mask fabricated by using the method has already been used for mass production, and, as proved in practice, the mask can excellently reduce dust and improve the effect of packaging of the displaying device.

An embodiment of the present disclosure further provides a fabricating method of a displaying base plate, wherein the method comprises:

S101: providing a base plate to be formed with a film.

It should be noted that the base plate to be formed with a film may be a wafer. The wafer comprises an active region and a non-active region surrounding the active region. The active region comprises a plurality of base-plate units, and each of the base-plate units comprises a displaying region and a non-displaying region. By cutting the plurality of base-plate units of the wafer, a plurality of displaying base plates can be obtained. Certainly, the base plate to be formed with a film may also be another base plate on which the film-layer pattern is required to be formed.

S102: providing the mask.

S103: aligning the base plate to be formed with a film and the mask, to cause the peripheral part of the mask to contact the base plate to be formed with a film, to support the base plate to be formed with a film, and to cause the opening of the mask part of the mask to correspond to a film-formation region of the base plate to be formed with a film, and the first main body of the mask part of the mask and the peripheral part of the mask to correspond to a non-film-formation region of the base plate to be formed with a film.

As an example, the base plate to be formed with a film is a 8-inch wafer. Referring to FIGS. 3, 4 and 7, its diameter is 200 mm, and the wafer comprises an active region and a non-active region surrounding the active region. The active region has a cross-section size perpendicular to the wafer of 194 mm, and comprises a plurality of base-plate units, and each of the base-plate units comprises a displaying region and a non-displaying region. If the wafer is to be used to form a plurality of micro-displaying devices, then, when the organic layer or the cathode is being formed on the wafer, the plurality of openings of the mask may individually correspond to the plurality of displaying regions (i.e., the film-formation region) of the wafer, the first main body of the mask may correspond to the non-displaying regions, and the peripheral part of the mask may correspond to the non-active region. At this point, the non-film-formation regions of the wafer include the non-displaying regions and the non-active region.

S104: depositing a film-layer material to the film-formation region of the base plate to be formed with a film via the opening of the mask part, to form the film-layer pattern.

As an example, the film-layer material may be deposited to the film-formation region of the base plate to be formed with a film via the opening of the mask part by using a vapor deposition or sputtering process, to form the film-layer pattern. The vapor deposition process is preferable for the deposition of the film-layer material, to reduce adverse affection to the mask.

The film-layer pattern is required to be determined according to actual situations, and the film-layer pattern may be the organic layer or the cathode, which is not limited herein.

The above are merely particular embodiments of the present disclosure, and the protection scope of the present disclosure is not limited thereto. All of the variations or substitutions that a person skilled in the art can easily envisage within the technical scope disclosed by the present disclosure should fall within the protection scope of the present disclosure. Therefore, the protection scope of the present disclosure should be subject to the protection scope of the claims.

The invention claimed is:

1. A mask, wherein the mask comprises a mask part and a peripheral part surrounding the mask part;
   the mask part comprises at least one mask unit, and the mask unit comprises an opening and a first main body surrounding the opening; and
   a thickness of at least part of area of the peripheral part is greater than a thickness of the mask part, and the peripheral part is configured to contact a base plate to be formed with a film, and support the base plate to be formed with a film, whereby the mask part and the base plate to be formed with a film have a gap therebetween;
   wherein the peripheral part comprises a second main body and a plurality of supporters; and
   the plurality of supporters are located merely within corner regions of the mask, and the first main body and the plurality of supporters have no overlapping part, whereby the first main body and the base plate to be formed with a film have a gap therebetween.

2. The mask according to claim 1, wherein
   the plurality of supporters are provided on one side of the second main body closer to the base plate to be formed with a film; and
   a thickness of the second main body and a thickness of the first main body are equal.

3. The mask according to claim 2, wherein the first main body and the second main body is of an integral structure, and the first main body and the second main body are formed by using a one-step patterning process.

4. The mask according to claim 2, wherein each of the plurality of supporters comprises a supporting gasket, and a thickness of the supporting gasket ranges from 90 μm to 110 μm.

5. The mask according to claim 1, wherein the peripheral part and an edge of the mask part form a step.

6. The mask according to claim 5, wherein a height of the step ranges from 40 μm to 100 μm.

7. The mask according to claim 1, wherein the peripheral part extends under a fixing unit, the fixing unit is configured to fix the mask.

8. A displaying base plate, wherein the displaying base plate comprises: a substrate and a film-layer pattern provided on the substrate, and the film-layer pattern is formed by using the mask according to claim 1.

9. A fabricating method of the mask according to claim 1, wherein the method comprises:
forming the mask part and the peripheral part surrounding the mask part.

10. The fabricating method of the mask according to claim 9, wherein
the step of forming the mask part and the peripheral part surrounding the mask part comprises:
forming the mask part and the second main body; and
forming the plurality of supporters.

11. The fabricating method of the mask according to claim 10, wherein after the step of forming the plurality of supporters, the step of forming the mask part and the peripheral part surrounding the mask part further comprises:
fixing the plurality of supporters to the second main body by using laser spot welding.

12. The fabricating method of the mask according to claim 9, wherein the step of forming the mask part and the peripheral part surrounding the mask part comprises:
forming a mask plate, wherein the mask plate comprises a mask region and a peripheral region surrounding the mask region; and
etching the mask region, to obtain the mask part and the peripheral part surrounding the mask part, wherein the peripheral part and an edge of the mask part form a step.

13. A fabricating method of a displaying base plate, wherein the method comprises:
providing the base plate to be formed with a film;
providing the mask according to claim 1;
aligning the base plate to be formed with a film and the mask, to cause the peripheral part of the mask to contact the base plate to be formed with a film, to support the base plate to be formed with a film, and to cause the opening of the mask part of the mask to correspond to a film-formation region of the base plate to be formed with a film, and the first main body of the mask part of the mask and the peripheral part of the mask to correspond to a non-film-formation region of the base plate to be formed with a film; and
depositing a film-layer material to the film-formation region of the base plate to be formed with a film via the opening of the mask part, to form a film-layer pattern.

14. The fabricating method of the displaying base plate according to claim 13, wherein the step of depositing the film-layer material to the film-formation region of the base plate to be formed with a film via the opening of the mask part, to form the film-layer pattern comprises:
depositing the film-layer material, by using a vapor deposition or sputtering process, to the film-formation region of the base plate to be formed with a film via the opening of the mask part, to form the film-layer pattern.

* * * * *